United States Patent [19]

Maiko

[11] 4,394,618
[45] Jul. 19, 1983

[54] DIGITAL TRACKING PHASE METER

[75] Inventor: Viktor P. Maiko, Gelendzhik, U.S.S.R.

[73] Assignee: Juzhnoe Proizvodstvennoe Obiedinenie Po Morskim Geologorazvedochnym Rabotam "JUZHMORGEOLOGIA", Gelendzhik, U.S.S.R.

[21] Appl. No.: 236,110

[22] Filed: Feb. 19, 1981

[51] Int. Cl.³ .......................................... G01R 25/00
[52] U.S. Cl. ............................... 324/83 D; 324/79 D
[58] Field of Search .............. 324/83 D, 79 D, 78 D; 364/484

[56] References Cited

U.S. PATENT DOCUMENTS 4,133,037  1/1979  Overman ......................... 324/83 D
4,178,631 12/1979  Nelson, Jr. ....................... 324/83 D
4,206,414  6/1980  Chapman ......................... 324/83 D Primary Examiner—Michael J. Tokar
Attorney, Agent, or Firm—Myron Greenspan; Burton L. Lilling; Bruce E. Lilling

[57] ABSTRACT

A digital tracking phase meter comprising a shaper of narrow pulses corresponding to a leading edge of an input square-shaped signal, connected by the output thereof to one input of a switch, the other input of which is applied to a data output of a phase cycle fraction reversible counter, and the output of which is connected to an input of a pulse counter. A countdown input of said pulse counter is connected to a count pulse generator, and the output thereof is connected to an input of a control pulse distributor switch. The other input of said switch is connected to an input of a control pulse distributor inverter and serves as an input of the digital tracking phase meter, whereas the output thereof is connected to a countup input of said phase cycle fraction reversible counter. An output of said inverter is connected to an input of another control pulse distributor switch, the other input of which is connected to an output of said pulse counter and the output of which is connected to a countdown input of said phase cycle fraction reversible counter. Outputs of said reversible counter are connected to countup and countdown outputs of a phase cycle integer reversible counter.

1 Claim, 1 Drawing Figure

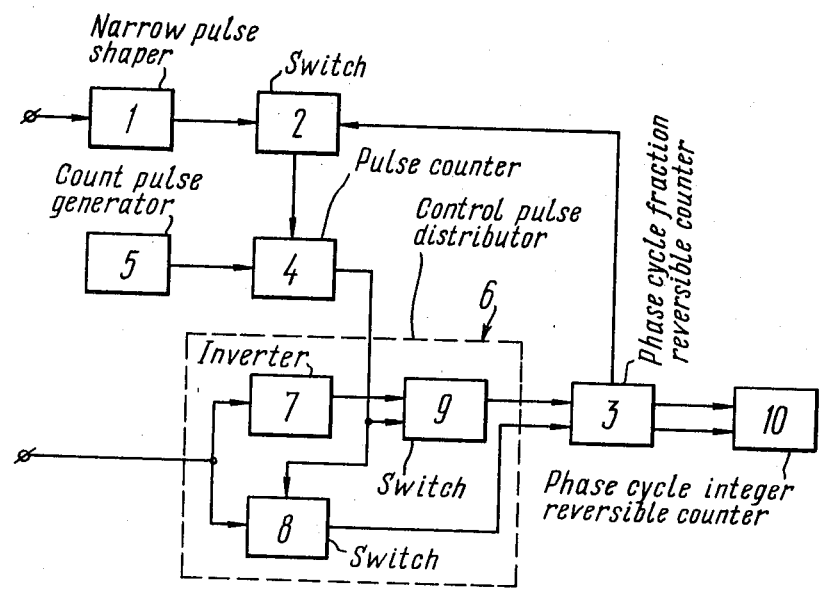

DIGITAL TRACKING PHASE METER

FIELD OF THE INVENTION

The present invention relates to radio instrumentation and, more specifically, to digital tracking phase meters used, for example, in measurements of phase difference of electrical signals produced by phase-comparison radio-navigation systems.

BACKGROUND OF THE INVENTION

At the present time, there are a number of publications, the constructional solutions of which are aimed at improvement of the accuracy and interference immunity of measuring equipment operating as part of phase-comparison radio-navigation systems. The progress in development of digital methods and constructional means substantially contributes to solution of the problems involved in simplification of the phase meter construction and improvement of phase meter quality characteristics.

The phase-comparison radio systems most commonly employ compensation phase meters hooked around an electromechanical system. However, the measuring accuracy and dependability of said phase meters are not sufficient and are determined by characteristics of such mechanical components as gearboxes, gears, and thoothed and worm gearings.

Serious complications occur in solving the problem of direct data input from the meter to the computer serving to process the navigational data. The use of extra mechanical converters for transforming the mechanical action into the digital code still further impairs the accuracy in measurement of such a navigational parameter as the phase difference.

Known in the art is a mobile receiving means of the Jorac type phase-comparison radio-navigation system manufactured by Seiscor, comprising receivers and an indicator unit, constituting a compensation tracking phase meter circuit incorporating a synchro-type phase shifter, a motor, a phase detector and a mechanical transmission. The radionavigation parameter values are injected into the computer through an analog-to-code converter. The foregoing receiving means permits measuring the phase shift of the radio system, the measuring accuracy being low because of the use of mechanical components.

There is also known a digital tracking phase meter (cf. USSR Inventor's Certificate No. 617747, filed on July 30, 1978), comprising two input shapers, the outputs of which are connected through two respective switches to inputs of an OR logic element; a count pulse generator connected to other inputs of said switches; and two dividing counters, one of these being a variable dividing factor counter connected to outputs of a reversible counter and OR logic element. The phase meter also comprises a switch set, a phase cycle integer reversible counter, a binary phase quantizer, an inverter and an equivalence unit, the inputs of which are connected to outputs of the binary phsse quantizer and reversible counter, and the output whereof is applied to a third input of the first switch, to the switch set and to a third input of the second switch through the inverter. Other inputs of the switch set are connected to the dividing counters, and the outputs thereof are connected through the reversible counter to the phase cycle integer reversible counter. The count pulse generator is connected to the first dividing counter, and the binary phase quantizer is connected to second inputs of the input shapers.

The above-mentioned digital tracking phase meter permits following the phase difference of input signals in any range of values and ensure optimal tracking of alterations of the input phase difference and the phase meter indication, whereby said phase meter can be used in phase-comparison radio-navigation systems. However, the foregoing phase meter is disadvantageous in that the interference immunity and speed of response thereof are not equally high throughout the measuring range. This irregularity in the phase difference measuring dynamic characteristics is attributed to nonlinearity of the digital tracking system upon which the tracking phase meter is based.

Still another digital tracking phase meter known in the art (cf. USSR Inventor's Certificate No. 576547, dated Nov. 15, 1977) comprises a shaper of narrow pulses corresponding to the forward edge of rectangular electric signals supplied to inputs of the digital tracking phase meter, one of said inputs being the input of said shaper, whose output is electrically connected to the input of the first switch whose output is connected to the input of the pulse counter whose counting input is electrically connected to a count pulse generator and the output thereof is connected to the input of control pulse distributor whose output is electrically connected to the countdown input of a reversible phase cycle integer counter whose countup input is electrically connected to an output of the switch of the control pulse distributor whose first input is electrically connected to the second input of the digital tracking phase meter, whereas respective outputs of the reversible phase cycle integer counter are connected to the countup and countdown inputs of the reversible phase cycle integer counter.

In said phase meter the count pulse generator is electrically connected to the countup input of the pulse counter via the first switch.

The control pulse distributor comprises apart from the switch a switching device, a code value comparator, a delay line and a flip-flop. The output of the switch is electrically connected to the countup and countdown inputs of the phase cycle fraction reversible counter via the code value comparator and the switching device coupled in series and is also electrically connected to the input of the flip-flop via the delay line. The output of the flip-flop is connected to the input of the switch whose another input is electrically connected to the input of the phase meter, whereas the input of the flip-flop is connected to the output of the narrow pulse shaper.

Electrical connection of the output of the pulse counter with the input of the control pulse distributor is effected through coupling the output of said pulse counter to the inputs of the code value comparator and the switching device, whose other inputs are connected to the output of the reversible phase cycle integer counter.

The linear tracking system upon which said phase meter is based provides for even interference immunity and speed of response throughout the measuring range. Yet, the construction of said phase meter is complicated, the aggregate is massive and the equipment includes such intricate devices as the code value comparator and switch set.

SUMMARY OF THE INVENTION

It is an object of the present invention to provide a digital tracking phase meter, the construction whereof is simple, with the dynamic characteristics maintained linear throughout the measuring range thereof.

This object is accomplished in a digital tracking phase meter comprising a narrow pulse shaper producing pulses corresponding to the leading edge of square pulses applied to inputs of said digital tracking phase meter, one of these inputs being an input of said shaper whose output is electrically coupled with an input of a first switch, whose output is connected to the input of the pulse counter, the count input of which is electrically connected to a count pulse generator, whereas the output thereof is connected to an input of a control pulse distributor, the output of which is electrically connected to a countdown input of a phase cycle fraction reversible counter whose countup input is electrically connected to an output of a switch of the control pulse distributor, the first input of which is electrically connected to a second input of the digital tracking phase meter, respective outputs of the phase cycle fraction reversible counter being coupled to the countup and countdown inputs of the phase cycle fraction reversible counter, wherein according to the invention, said control pulse distributor comprises an inverter, the input of which is connected to a first input of a main switch in said distributor, and the connection point serves directly as a second input of said digital tracking phase meter, and incorporates an additional switch, the first input of which is connected to an output of the inverter, the second input of which is applied to the second input of the main switch, and the output of which is coupled with said countdown input of said phase cycle fraction reversible counter, with said countup input of said phase cycle fraction reversible counter connected directly to the output of the main switch in the control pulse distributor, the data output of which is connected to said second input of the first switch, the first input of which is directly connected to said output of said narrow pulse shaper, and with the count pulse generator directly connected to said count input of said pulse counter operating under countdown conditions, whereas the put of the pulse counter is connected to the second input of the main switch incorporated into the control pulse distributor.

The digital tracking phase meter of the present invention provides for accurate measurements of phase difference and maintains high interference immunity and speed of response.

BRIEF DESCRIPTION OF THE DRAWING

The invention will now be described in greater detail with reference to a preferred embodiment thereof taken in conjunction with the accompanying drawing showing a block diagram of a digital tracking phase meter according to the invention.

DETAILED DESCRIPTION OF THE INVENTION

The digital tracking phase meter of the present invention is designed to operate as part of a receiver and display unit in a radio-navigation system. The digital tracking phase meter comprises a narrow pulse shaper 1, the input of which is a first input of the digital tracking phase meter. The narrow pulse shaper 1 generates narrow pulses corresponding to the leading edges of square signals applied to the input thereof and to a second input of the phase meter.

The digital tracking phase meter also comprises a switch 2, the input of which is connected to an output of the narrow pulse shaper 1, and a phase cycle fraction reversible counter 3. The reversible counter 3 serves to measure the phase difference within the limits of one phase cycle from 0 to 360 deg, and in the respective range from 0 to 99 centicycles. The total capacity of the phase cycle fraction reversible counter 3 is equal to the number system base N. A data output of the phase cycle fraction reversible counter 3 is connected to another input of the switch 2.

The digital tracking phase meter incorporates a pulse counter 4 and a count pulse generator 5. The total capacity of the pulse counter is equal to the base N (defined above). The pulse counter 4 operates under countdown conditions, and a borrow pulse is produced across an output of the pulse counter 4 when the number recorded by the pulse counter 4 overflows N. In this embodiment the resetting input in the pulse counter 4 is connected to an output of the switch 2.

The count pulse generator 5 shapes count pulses at a repetition frequency $f = Nf_c$, where $f_c$ is the signal frequency at which the phase difference is being measured. An output of the count pulse generator 5 is connected to a countdown input of the pulse counter 4.

The digital tracking phase meter employs a control pulse distributor 6. The function of the control pulse distributor is to supply pulses either to a countup or countdown input of the phase cycle fraction reversible counter 3 according to the polarity of the input signal and to the time when a borrow pulse is received from the output of the pulse counter 4. In its turn, the control pulse distributor 6 comprises an inverter 7 and switches 8 and 9. An input of the inverter 7 is connected to an input of the switch 8, and the connection point serves as a second input of the digital tracking phase meter. An output of the switch 8 in the control pulse distributor 6 is connected to the countup input of the phase cycle fraction reversible counter 3, and an output of the inverter 7 is connected to an input of switch 9. An output of the switch 9 is in turn connected to the countdown input of the phase cycle fraction reversible counter.

Second inputs of switches 8 and 9 in the control pulse distributor are interconnected and coupled electrically with the output of the pulse counter 4.

The digital tracking phase meter comprises a phase cycle integer reversible counter 10, the countup and countdown inputs of which are connected to the respective outputs of the phase cycle fraction reversible counter 3.

The digital tracking phase meter operates as follows. The narrow pulse shaper 1 generates narrow pulses corresponding to the leading edges of square signals applied to the first input of the digital tracking phase meter. The narrow pulses derived from the output of the narrow pulse shaper 1 trigger the switch 2 for a time equal to the narrow pulse duration, and thereby set the pulse counter 4 for a numerical value L recorded by the phase cycle fraction reversible counter 3. After the pulse counter 4 records the numerical value L, the generator 5 counts down the value L, whereupon the output of the pulse counter 4 produces a borrow pulse forwarded to the switches 8 and 9 of the control pulse distributor, and then supplied either to the countup or countdown input of the phase cycle fraction reversible counter 3 according to which of the switches is conducting.

When the pulse is applied to one input of the phase cycle fraction reversible counter 3, a value L+1 or L−1 is set in the phase cycle fraction reversible counter 3.

The value L shall be set in the phase cycle fraction reversible counter in compliance with the phase variation principle, and shall correspond to the phase difference being measured.

Suppose that the value L in the phase cycle fraction reversible counter 3 exceeds the value of the phase difference being measured, that is, L>a, where a is the value of the phase difference to be measured. Then, the narrow pulse put out by the narrow pulse shaper 1 and corresponding to the leading edge of the input signal will set the switch 2 to a conductive state and will set the value L in the pulse counter 4. The pulse counter 4 will subtract the count pulses and will put out a borrow pulse. Thus, the leading edge of the signal across the input of the narrow pulse shaper 1 will be delayed by the value L. In this case the pulse counter will function as a digital phase shifter.

The pulse at the output of the pulse counter 4 will be aligned in time with the negative half-wave of the square signal applied to the input of the control pulse distributor from the second input of the phase meter. During this period, the inverter 7 of the control pulse distributor will shape a positive potential which sets the switch 9 in the control pulse shaper to a conducting state. The pulse supplied from the output of the pulse counter 4 through the switch 9 of the control pulse distributor will be applied to the countdown input of the phase cycle fraction reversible counter 3 and will reduce the value L by a unity.

Successive subtraction of unities from the previous readings L in the phase cycle fraction reversible conter will continue during n periods of the signal being measured, with n=L−a, where n is the initial misalignment of the value L in the phase cycle fraction reversible counter 3 and the true phase difference a.

Suppose, the value L in the phase cycle fraction reversible counter 3 is below the value of the phase difference to be measured, that is, L<a. Then, the pulse counter 4 will put out a pulse aligned in time with the positive half-wave of the square pulse applied to the input of the control pulse distributor 6. The switch 8 of the control pulse distributor 6 will start conducting. The pulse derived from the output of the pulse counter 4 through the switch 8 of the control pulse distributor will be applied to the countup input of the phase cycle fraction reversible counter 3, and the value L will be increased by a unity.

Successive addition of the unities to the previous readings L of the phase cycle fraction reversible counter 3 will continue during n periods of the signal to be measured, with n=a−L, where n and a are the quantities defined hereinabove.

The phase cycle integer reversible counter 10 records the overflow pulses received from the phase cycle fraction reversible counter 3, and thus counts the number of complete cycles.

The digital tracking phase meter of the present invention permits following the phase difference variation at a rate depending on the frequency of the signals being monitored. In all cases, the phase difference variation is followed by the shortcut method. The circuit design of the phase meter according to the invention permits measurements of phase difference in all ranges of values.

The digital tracking phase meter of this invention employed in set with a receiver and display unit in radio-navigation systems provides a means of simple circuit design for measurements of phase difference to a required accuracy at high interference immunity conditions.

What is claimed is:

1. A digital tracking phase meter, comprising:

a narrow pulse shaper, the input of which serves as a first input of said digital tracking phase meter to which square signals are applied, and the output of which shapes pulses corresponding to the leading edge of said input signal;

a first switch, the first input of which is connected to said output of said narrow pulse shaper, with said first switch incorporating a second input and an output;

a pulse counter comprising an input, a countdown input, an output, with said input connected to said output of said first switch;

a count pulse generator, the output of which is connected to said countdown input of said pulse counter;

a control pulse distributor incorporating a first input serving as a second input of said digital tracking phase meter to which said input square pulses are applied, a second input connected to said output of said pulse counter, and first and second outputs;

a phase cycle fraction reversible counter incorporating countup and countdown inputs connected respectively to said first and second outputs of said control pulse distributor, a first data output connected to said second input of said first switch, and second and third outputs;

a second switch included in said control pulse distributor and furnished with a first input which is said first input of said distributor, a second input which serves as said second input of said distributor, and said output serves as a first output of said distributor;

an inverter included in said control pulse distributor and furnished with an input connected to said first input of said second switch and an output;

a third switch included in said control pulse distributor and furnished with a first input connected to said output of said inverter, with a second input connected to said second input of said second switch, and with an output serving as said second output of said distributor; and a phase cycle integer reversible counter incorporating countup and countdown inputs connected to said second and third outputs of said phase cycle fraction reversible counter, respectively.

* * * * *